United States Patent [19]

Deurloo

[11] Patent Number: 4,543,448

[45] Date of Patent: Sep. 24, 1985

[54] ELECTRICAL CORD SET HAVING A MAGNETICALLY IDENTIFIABLE CONDUCTOR, AND A METHOD OF AUTOMATICALLY MANUFACTURING SUCH A CORD SET

[75] Inventor: Johannis M. Deurloo, Emmen, Netherlands

[73] Assignee: N. K. F. Groep B.V., Netherlands

[21] Appl. No.: 613,750

[22] Filed: May 23, 1984

Related U.S. Application Data

[63] Continuation of Ser. No. 362,000, Mar. 25, 1982, abandoned.

[30] Foreign Application Priority Data

Mar. 30, 1981 [NL] Netherlands ............... 8101540

[51] Int. Cl.⁴ ............................................. H01B 7/36
[52] U.S. Cl. ..................................... 174/112; 174/115; 339/113 R; 339/184 M
[58] Field of Search ....................... 174/112, 115; 339/113 R, 184 R, 184 M

[56] References Cited

U.S. PATENT DOCUMENTS

| | | | |
|---|---|---|---|
| 1,992,656 | 2/1935 | Fletcher | 174/15 |
| 2,306,206 | 12/1942 | Dalgleish | 339/184 M |
| 3,093,434 | 6/1963 | Francis | 339/195 |
| 3,185,953 | 5/1965 | Prifogle | 339/184 M |
| 3,662,257 | 5/1972 | Fujiwara | 324/207 X |
| 3,805,218 | 4/1974 | Voida | 174/115 X |
| 4,188,080 | 2/1980 | Streble | 174/115 X |

FOREIGN PATENT DOCUMENTS

| | | | |
|---|---|---|---|
| 1896566 | of 0000 | Fed. Rep. of Germany . | |
| 1132615 | 1/1963 | Fed. Rep. of Germany . | |
| 1907946 | 1/1971 | Fed. Rep. of Germany | 174/115 |
| 1765075 | 7/1971 | Fed. Rep. of Germany | 174/112 |
| 2059566 | 6/1972 | Fed. Rep. of Germany | 174/115 |
| 2282772 | 4/1975 | France . | |
| 86482 | 6/1978 | Japan | 174/112 |
| 54314 | 11/1942 | Netherlands | 174/115 |
| 621516 | 11/1945 | Sweden | 174/115 |

OTHER PUBLICATIONS

Alien Property Custodian; Becket, Charles Murray; Serial No. 218,848; published Jun. 8, 1943; "Electric Cables".

*Primary Examiner*—A. T. Grimley
*Assistant Examiner*—Morris H. Nimmo
*Attorney, Agent, or Firm*—David R. Treacy

[57] ABSTRACT

An electric cord set having a plurality of stranded conductors and a connection plug with an identifying connection element, such as a grounding pin, the identified connection element being connected to a conductor identified by having a higher magnetic permeability than the other conductors. Preferably, the ground wire is made of wire strands similar to the other conductors, but contains 1 to 3 auxiliary steel wire strands. In a method and device for manufacturing such a cord set, the cord is arranged next to a magnetic sensing element and rotated about the cord axis automatically while the permeability is sensed. The cord is then fixed in a position of highest or lowest detected permeability, so as to identify the location of the unique conductor, and the plug is then connected.

2 Claims, 4 Drawing Figures

ELECTRICAL CORD SET HAVING A MAGNETICALLY IDENTIFIABLE CONDUCTOR, AND A METHOD OF AUTOMATICALLY MANUFACTURING SUCH A CORD SET

This is a continuation, of application Ser. No. 362,000, filed Mar. 25, 1982, now abandoned.

BACKGROUND OF THE INVENTION

The invention relates to a method of manufacturing a cord set. A cord set is a multi-core flexible electric cord which has a plug at one end. The other end of the cord comprises the free ends of the cores or has a coupling plug or an appliance plug. Cord sets are used in particular for the connection of all kinds of electrical appliances to the supply current mains. A cord set comprises at least two cores which ensure the current supply and usually a third core, the so-called ground wire, which is a safety connection.

Each core comprises an insulation of synthetic resin or rubber provided around a conductor, while the collective cores (insulated conductors) are embedded within an outer cover of rubber or synthetic resin.

It has so far not proved possible to produce a cord set fully automatically, i.e. without human intervention.

It is an object of the invention to provide a fully automatic method of manufacturing a cord set.

A further object of the invention is to provide a safe and reliable method of manufacturing in which notably the ground wire of the flexible electric lead (cord) can be connected to an identified connection element such as the ground pin or brace of the desired plug with an optimum degree of reliability.

Still another object of the invention is to provide a method of manufacturing a cord set in which the resulting product can be tested simply and efficaciously.

According to the invention these objects are achieved with a method of manufacturing a cord set in which an electric cord which, within a common cover of rubber or synthetic resin, comprises two or more insulated conductors, has auxiliary means by which one insulated conductor has a magnetic permeability which differs from the other insulated conductor(s). The cord is introduced into a device for the detection of magnetic permeability, the position of the insulated conductor provided with auxiliary means is determined on the basis of the difference in magnetic permeability, and the cord in a fixed position is provided on at least one end with a plug according to a conventional method.

Thus the insulation mantle of one insulated conductor may comprise homogeneously dispersed particles having a high magnetic permeability such as ferrite particles so that this insulated conductor has a magnetic permeability different from that of the other insulated conductor(s).

In a preferred embodiment of the invention, the aforesaid auxiliary means are formed by one or more auxiliary wires having a magnetic permeability which differs from that of the conductor.

In a further favourable embodiment, in the method in accordance with the invention an electric cord is used which comprises three insulated conductors of which the insulated conductor serving as ground wire is provided with the auxiliary wire or the auxiliary wires.

The insulated conductors comprise a conductive core of copper or tin-plated copper and an insulation of synthetic resin, for example polyvinyl chloride, polyethylene or rubber. The insulation of the earth wire has a standardized yellow-green colour band which differs from the brown and blue colour of the current conductors. The common outer cover is manufactured, for example, from polyvinyl chloride, polyethylene or rubber.

The auxiliary wire has a magnetic permeability differing from the above-mentioned copper or tin-plated copper and comprises in particular magnetic or magnetizable material. By way of example, the auxiliary wire may be a textile wire which is impregnated with a synthetic resin in which particles of a magnetic or magnetizable material are finely divided, for example, Fe particles, $Fe_2O_3$ particles, or $CrO_2$ particles. The auxiliary wire may also be manufactured entirely from a synthetic resin comprising the above-mentioned particles. To be preferred is an auxiliary wire of a ferromagnetic material, for example an Fe wire or a wire of an Fe-containing alloy, in particular a steel wire.

The auxiliary wire may be connected on or in the insulation of the insulated conductor but is preferably present inside the insulating cover.

The device for detecting the magnetic permeability is of a conventional type and in a simple embodiment comprises an electric coil. Alternatively a so-called Hall generator may be used which is a semiconductor element for determining magnetic field strengths. The end of the cord to which the plug is connected is introduced into the detection device. The outer cover of the cord end may or may not be removed over a small length of, for example, a few centimeters. In a suitable practical embodiment the outer cover is removed over a length of 2 to 3 cm and the ends of the insulated conductors are clamped. The clamped conductors are rotated in the recording device, and the rotary position of the cord with clamped conductors for which the detection device gives a previously adjusted signal is then determined. The location of the insulated conductor provided with one or more auxiliary wires, in particular the ground wire, is thus known. The relevant signal may be based on the detection or recording of a maximum magnetic flux, which means that the ground conductor is present at a minimum distance from the electric coil of the detection device and, for example, is the uppermost of three insulated conductors. The signal may alternatively be tuned to the recording of a minimum flux, in which the earth conductor is in a lowermost position.

In the above-mentioned rotary position, i.e. the position with known location of the earth wire, the cord is fixed and then provided with a plug in a usual mechanical manner.

Such a method is known, for example, from French Pat. No. 2,282,772, German Auslegeschrift Nos. 1,132,615 and 1,515,753. According to the known method the insulation cover of each insulated conductor is cut away over a small length and a contact sleeve or pin is mounted on the exposed conductors. The housing manufactured from a synthetic resin is then provided by interconnecting the composing parts of the housing, usually two parts, while enclosing the contact pins and sleeves. A frequently used connection is a snap fastener, a glued joint or a connection obtained by fusion. A housing of synthetic resin moulded around the pins or sleeves is also possible.

The cord set obtained in this manner can be measured electrically in a simple and efficacious manner by locating the ground wire at the free end of the cord in the above-described manner by means of the detection device for magnetic permeability, and then establishing an electric voltage on the ground wire. An electric voltage will be observed, at the other end of the cord, on the pin or brace which is connected to the ground wire.

In a preferred embodiment of the method in accordance with the invention an electric cord is used of which the insulated conductor which is provided with one or more auxiliary wires, in particular the ground conductor, comprises a bundle of electrically conductive wire strands of, for example, copper or tin-plated copper to which one or more auxiliary wires or wire strands have been added.

With this measure the manufacture of the magnetically detectable insulated conductor, such as the earth conductor, becomes substantially identical to that of the other insulated conductors which preferably also comprise a bundle of electrically conductive wire strands, of course without the auxiliary wires. The wires of the bundle may run parallel to each other or may be stranded. It is also achieved that the mechanical properties of the magnetizable detectable conductor, in particular the tensile strength, elongation upon fracture and so on do not differ considerably from those of the other conductors so that the mechanical characteristic of the cord set, such as the flexibility thereof, is not changed or is changed only to a small extent when a magnetizable detectable conductor is used.

These favorable aspects are obtained in particular when the auxiliary wires in the bundle have the same or substantially the same diameter as the electrically conductive wires.

Experiments have demonstrated that a conductor which comprises 20 strands of tin-plated copper each having a diameter of 0.20 mm has a tensile force of 162–164 N. The same conductor provided with an extra steel wire having a diameter of 0.20 mm has a tensile force of 172–173 N. The elongation upon fracture of the firstmentioned conductor manufactured entirely from copper was 25.0 to 27.2%, while the conductor provided with a steel wire showed an elongation upon fracture of 22.0 to 26.0%. When two steel wires are added the tensile force is 183 to 184 N and the elongation upon fracture is 23.5 to 28.7%.

The invention also relates to a device for carrying out the above-described method in which the device comprises a magnetic detector which is connected electrically to a driving mechanism for rotation of an electric cord, a clamping member for fixing the position of the electric cord, as well as conventional means for mounting a plug to one end of the fixed electric cord.

Such conventional means are described in the abovementioned publications.

In a preferred embodiment of the device in accordance with the invention the magnetic detector is connected to the driving mechanism via a memory element, for example, a microprocessor.

In a further preferred embodiment the driving mechanism is a stepping motor which has a shaft provided with teeth which can be coupled to a sliding element comprising two parallel guide rails which extend at some distance from each other and which can be moved relative to each other and on the facing surfaces have teeth which co-operate with the teeth of the shaft of the stepping motor.

The invention will be described in greater detail with reference to the drawing.

DESCRIPTION OF THE PREFERRED EMBODIMENT

Figure 1:
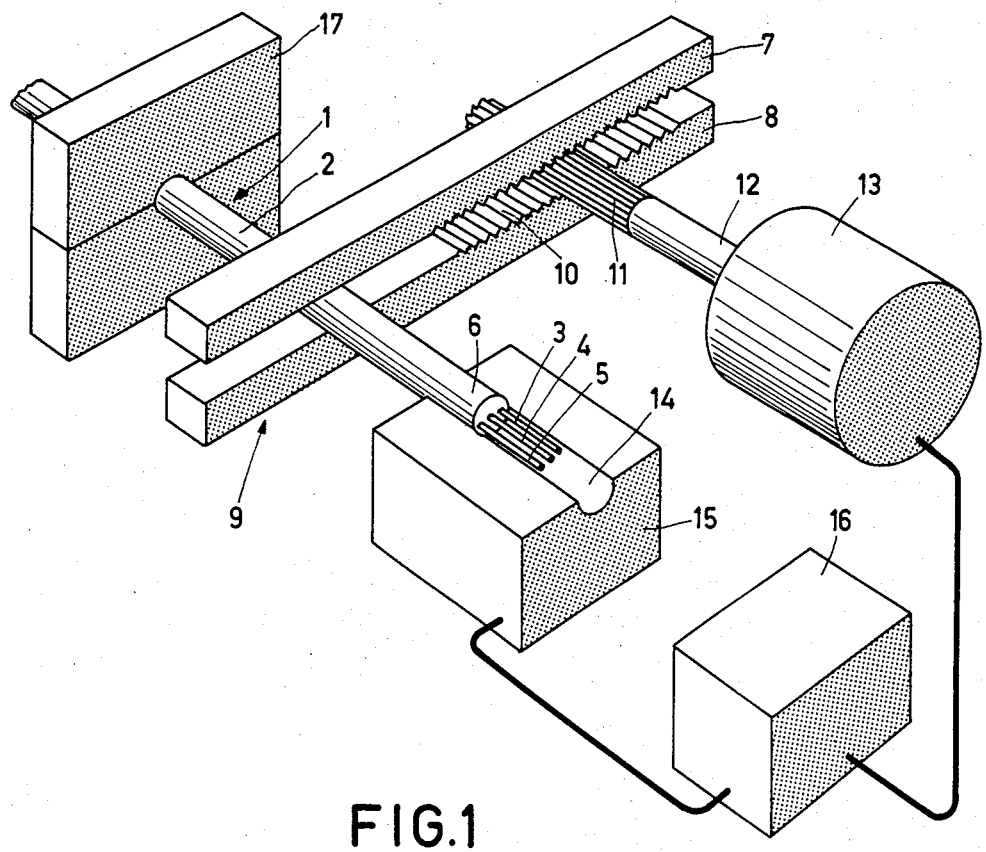
FIG. 1 is a diagrammatic perspective view of a device for locating a selected conductor of a cord in accordance with the invention.

Reference numeral 1 in FIG. 1 denotes an electric cord which comprises three insulated conductors 3, 4, 5 within an outer cover 2. Each insulated conductor consists of a conductive core 23, 24, 25 which is a litz wire of 20 elementary wires 26 of tin-plated copper each having a diameter of 0.2 mm, surrounded by an insulation of synthetic resin. One of the insulated conductors, for example conductor 3, has a conductive core 23 which in addition to the 20 copper wires 26 also comprises one steel wire strand 27 having a diameter of 0.20 mm. At one end 6 of the electric cord 1 the outer cover has been removed over a length of 2 to 3 cm. Cord 1 is held between two parallel guide rails 7, 8 of sliding element 9. The facing surfaces of guide rails 7, 8 are provided over a part of the length with teeth 10 in which the teeth 11 of shaft 12 of stepping motor 13 fit. By rotation of shaft 12, rails 7, 8 move relative to each other so that the clamped cord 1 is also rotated. The end 6 of cord 1 is present in the measuring slot 14 of the magnetic detector 15, in this case an electric coil.

Figure 2:
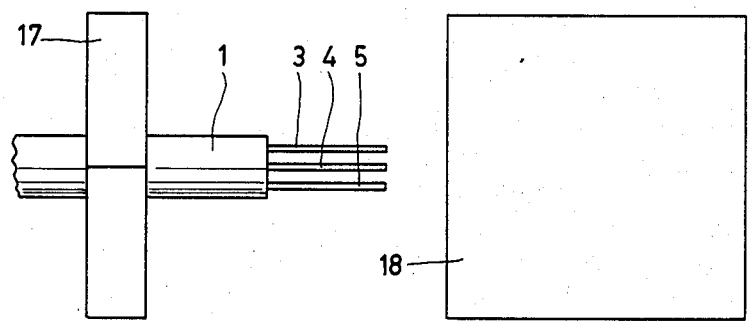
FIG. 2 is a diagrammatic view of the plug mounting device used with the FIG. 1 device.
Figure 3:
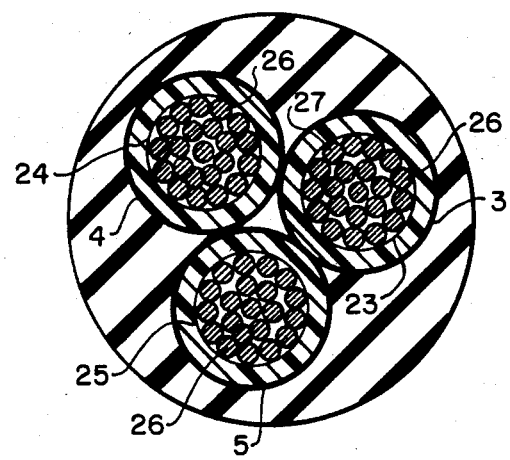
FIG. 3 is a cross-section of a cord showing one conductor as including a magnetically identifiable strand.
Figure 4:
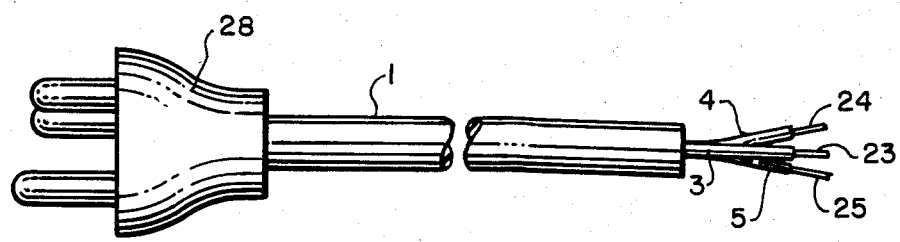
FIG. 4 is a diagrammatic view of the completed cord set.

For reasons of clarity the insulated conductors 3, 4 and 5 extending in the measuring slot 14 are shown in FIGS. 1 and 2 to be in a parallel position. In practice the conductors 3, 4 and 5 together will have a trangular to circular cross-section. The magnetic detector 15 is connected to stepping motor 13 via a memory element 16. The operation of the device is as follows.

The outer cover 2 of cord 1 is removed over a length of a few centimeters and, via sliding element 7 in which the cord is guided between rails 7, 8, the cord is introduced into the magnetic detector 15 in such manner that the end 6 of cord 1 with the ends of the conductors 3, 4, 5 lies in the measuring slot 14. The stepping motor 13 is coupled to sliding element 9 in which teeth 11 on shaft 12 of motor 13 co-operate with teeth 10 of the rails 7, 8. Stepping motor 13 is actuated, shaft 12 being rotated stepwise over 360° by small steps. As a result of this, rails 7, 8 move relative to each other, the clamped cord 1 being also rotated through 360°. During said rotation the insulated conductor 3 in measuring slot 14 provided with a steel wire strand 27 will pass a previously adjusted measuring position, for example, a lowermost position. The angular rotation, that is the number of arc degrees necessary to reach the measuring position, is recorded and stored in the memory element 16. After the abovementioned rotation over 360° the cord 1 is again in the initial position and by means of the stepping motor 13 it is then rotated back, according to the indication of the information stored in the memory element 16, over the above-mentioned number of arc degrees which was necessary during the first rotation to reach the measuring position. In this position of the cord 1 the location of the insulated conductor 3 (ground wire) provided with a steel wire strand 27 is known. The position of the cord 1 is fixed by means of clamping member 17 after which the clamped cord, with known location of the earth wire, is introduced into the known device 18 for mounting a plug 28 to the fixed cord end (FIG. 2).

The other end of cord 1 not shown in FIG. 1 is treated in the same manner as described above. At this other end, the position of the insulated conductor (ground wire) comprising a steel wire is also determined. A coupling plug or appliance plug may then be mounted to said other end, with the fixed position of the earth conductor, in the usual manner, in which of course the earth wire is connected to the earth plug or earth pin of the plug. The cord set can be measured by applying a voltage to the ground pin of the plug at one or both ends, which voltage has to be observed on the ground pin of the plug of the other end.

A cord set obtained according to the invention and having a plug at only one end is measured by first determining the position of the ground wire at the free cord end according to the detection method described, then applying a voltage to the ground conductor, and finally checking the ground pin of the contact plug for the presence of voltage.

What is claimed is:

1. An electrical cord set comprising a plural stranded-conductor cord and a plural connection plug, respective conductors being connected to respective plug connection elements, one of said connection elements having an identifying characteristic used for orientation of the plug, characterized in that said one connection element is connected to one conductor characterized by having a magnetic permeability different from that of the other conductors, said one conductor comprising a plurality of strands substantially identical to strands of the other conductors and auxiliary means for causing the magnetic permeability of said one conductor to be different from that of the other conductors.

2. A cord set as claimed in claim 1, wherein said one conductor comprises an auxiliary strand of wire having higher magnetic permeability than the other strands.

* * * * *